United States Patent [19]
Harvey et al.

[11] Patent Number: 4,686,384
[45] Date of Patent: Aug. 11, 1987

[54] FUSE PROGRAMMABLE DC LEVEL GENERATOR

[75] Inventors: Ian E. Harvey; David G. Williams, both of Melbourne; Barbara J. Fisher; Timothy J. Johnson, both of Palm Bay, all of Fla.

[73] Assignee: Harris Corporation, Melbourne, Fla.

[21] Appl. No.: 763,861

[22] Filed: Aug. 9, 1985

[51] Int. Cl.[4] .................. H03K 19/094; H03K 19/173; G11C 17/00; G11C 7/00

[52] U.S. Cl. .................................. 307/202.1; 307/450; 307/468; 307/263; 307/601; 365/96; 340/825.84

[58] Field of Search ...................... 307/201.1, 465, 468, 307/469, 448, 451, 263, 268, 601, 602, 605, 450; 365/96, 103, 104; 340/825.83, 825.84

[56] References Cited

U.S. PATENT DOCUMENTS

| | | | |
|---|---|---|---|
| 4,417,154 | 11/1983 | Kuo | 307/202.1 |
| 4,446,534 | 5/1984 | Smith | 307/475 X |
| 4,480,199 | 10/1984 | Varshney et al. | 307/202.1 X |
| 4,499,387 | 2/1985 | Konishi | 307/451 X |
| 4,533,841 | 8/1985 | Konishi | 307/451 X |
| 4,592,025 | 5/1985 | Takemae et al. | 365/96 |
| 4,593,203 | 6/1986 | Iwahashi et al. | 307/450 X |
| 4,605,872 | 8/1986 | Rung | 307/585 X |

*Primary Examiner*—Stanley D. Miller
*Assistant Examiner*—David R. Bertelson
*Attorney, Agent, or Firm*—Thomas N. Twomey; Charles C. Krawczyk

[57] ABSTRACT

A high reliability, low power fuse programmable DC level generator is implemented by providing at least one fuse in each branch of a resistive bridge such that programming of the level generator results in providing a blown fuse in the current path and as a consequence results in low current and low power under all operating conditions.

19 Claims, 6 Drawing Figures

FUSE PROGRAMMABLE DC LEVEL GENERATOR

BACKGROUND OF THE INVENTION

In many circuit applications a simple programmable active high or active low level must be established. Preferably the creation of the active high or active low signal is implemented with an arrangement requiring a minimum of power. Typically, this arrangement has been established by using a resistor bridge wherein one portion, for instance, the upper portion of the bridge comprises a resistor and the lower portion of the bridge is implemented with a single fuse. In order to program the device all that need be done is to either permit the fuse to remain intact in which case the logic level would be low due to the relatively low resistance of the conducting fuse relative to the resistor. Alternatively, if the fuse were blown, the relative resistance of the blown fuse would be significantly greater than the resistance of the resistor and the device would be programmed high. To provide a lower power and more reliable programming arrangement it is necessary to provide a very significant decrease in the current used by the circuit while maintaining a large relative difference in resistance between the two branches of the resistive bridge. While the prior resistive bridge arrangement is relatively easy to implement, it has several drawbacks when adopted in an MOS application. The standby current of this device is unreasonably high for low power applications and the need for a resistor of significant resistance results in the use of a substantial amount of area on the die. In a CMOS application where power consumption is a primary concern, the prior resistor bridge arrangement causes an excessive current drain, particularly for battery powered applications.

Another aspect of the present invention relates to problems which have existed with the prior resistive bridge arrangement including the failure of the fuse to remain in a blown state due to electrical conduction and refabrication of a conductor at the fuse location, partial blowing of the fuse causing increased resistance yet maintaining enough conductivity to prevent the resistive bridge from establishing a definite logic level and finally, the failure of the fuse to blow under programming level voltage and current resulting in an incorrectly programmed device. While no one of these problems is so significant as to render the prior arrangement unacceptable, the combination of these problems does result in a decrease in the number of acceptable circuits generated in the fabrication process. As a result of the above problems, the defective circuits generally render the entire device inoperative. Thus, the elimination of any of the above problems results in a very substantial savings in the manufacture of products utilizing such circuits. Ideally, the elimination of such problems should be easily implemented and inexpensive.

SUMMARY OF THE INVENTION

In accordance with the present invention, a second fuse element is provided in series with the resistor on the upper portion of the bridge arrangement and the size of the resistor is reduced. This arrangement will provide several benefits relative to the prior art. Specifically, rather than relying on the resistor alone to provide a voltage drop, and allowing current to flow through devices being programmed to a logical low level, the upper fuse is blown, thus providing an open circuit such that the circuit has very low power consumption relative to the device of the prior art. When the upper fuse is blown, the resistance in the upper branch of the circuit is much greater, perhaps by a factor of 100, than is the resistance of the single resistor previously provided. Thus, in this arrangement the circuit draws 1% as much current. Additionally, due to the greater relative differences in resistances in the circuit, the potential difference between high and low input levels is substantially increased.

In another embodiment of the invention, multiple fuses are used in each of the upper and lower branches of the circuit. This multiple fuse concept eliminates the problem previously associated with fuses that don't work either by failure to blow under programming conditions or alternatively due to fuses which have a higher than average resistance. This is caused by the substantially higher resistance of the multiple blown fuse arrangement relative to the remaining branch of the bridge circuit which contains the defective fuse. Similarly, in instances where contamination in the semiconductor device may cause a blown fuse to again become conductive, the present invention reduces the relative detriment to circuit operation.

Yet another advantage of the multi-fuse circuit arrangement is that standby current is reduced on this circuit due to the significant increase in resistance provided by the multiple blown fuses relative to the resistance of the resistor alone or even of a single blown fuse.

While the present invention is described with respect to fuses which are originally conducting and which are rendered non-conducting by "blowing" the fuse, it is to be understood that the benefits of the invention may be obtained by use, for example, of fuses which are originally non-conducting and which are rendered conductive by fusing.

DETAILED DESCRIPTION OF THE INVENTION

Figure 1:
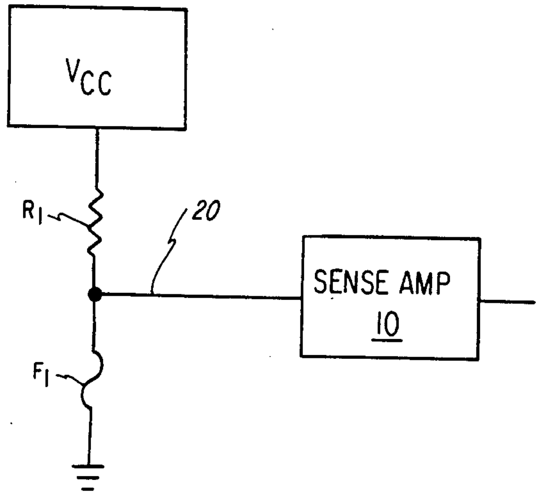
FIG. 1 is a circuit diagram of the sense amp arrangement utilized in the prior art.
Figure 2:
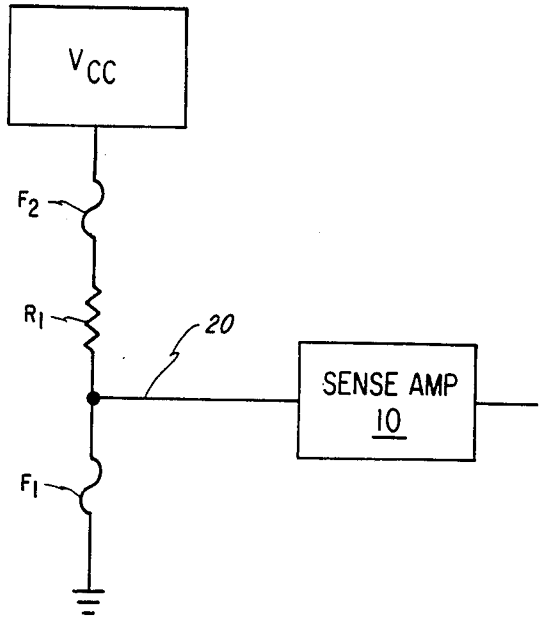
FIG. 2 is a circuit diagram of a circuit incorporating the invention.

Referring to the figures, one embodiment of the present invention is illustrated in FIG. 2 which shows a simple manner of implementing the invention. The sense amp 10 is capable of detecting either a voltage high or a voltage low condition on input line 20. Ordinarily, the voltage on input line 20 is controlled by the bridge network between power source $V_{CC}$ and ground. As can be seen, the resistor $R_1$ is in the portion of the circuit between $V_{CC}$ and the sense amp input line 20. Additionally, the fuse $F_1$ is in the branch of the bridge between input line 20 and ground. According to the invention, new fuse $F_2$ is provided in the upper portion of the bridge network. In order to appreciate the benefits offered by the addition of fuse $F_2$, it is only necessary to review FIG. 1 illustrating the prior art implementation. In operation, the fuse can be either left unblown or can be blown to program the input line 20. Thus, in the event that it is desired to have input line 20 at a voltage low condition, fuse $F_1$ is left in its conducting condition in which case its resistance, of approximately 500 ohms, is much less than the resistance or $R_1$ which typically is on the order of 100K ohms. Thus, when fuse $F_1$ is unblown and hence conducting, input line 20 is at a voltage low. The current required in this situation, assuming a 5 volt power supply, is approximately 50 microamps, unreasonably high for most battery powered applications.

Alternatively, when fuse $F_1$ is blown, its resistance is in the range of 1 megaohm to 10 megaohms since it can be up to 10 megaohms this value is used for illustrative purposes in the present specification. In this case the voltage at line 20 is held substantially closer to $V_{CC}$ than to ground thus causing sense amp 10 to detect a voltage high condition. In this situation, the current drain is $1/100^{th}$ the drain of the active low condition.

Returning to FIG. 2 and the arrangement of the present invention, it may now be easily seen that the provision of fuse $F_2$ permits a substantial reduction in current drawn at voltage low conditions. For instance, when fuse $F_2$ is blown the resistance on the upper portion of the bridge is approximately 10.1 megaohms rather than the 0.1 megaohm previously provided. Thus, the current required to establish the voltage low condition at the sense amp will be about 100 times less than the current required under the prior arrangement.

To appreciate another benefit of this arrangement, it must be evaluated in light of the various possible fault conditions associated with the failure of fuse $F_1$. Assuming first a desired voltage low condition at the sense amp, it is necessary to maintain a high resistance on the upper portion of the bridge circuit and a relatively low resistance in the lower portion of the bridge circuit. Thus, it is desired to maintain fuse $F_1$ in an unblown (conducting) condition and to blow fuse $F_2$. Thus, the resistance in the upper portion of the bridge will be 10.1 Mega-ohm (the sum of the resistances of $F_2$ and $R_1$) and the resistance in the lower portion will be about 500 ohms with the normal range being from about 100 ohms to about 1000 ohms. However, even if fuse $F_2$ fails to blow under normal programming conditions, the resistor in the upper portion of the bridge will at least insure performance equivalent to the prior art arrangement. Additionally, there will be some resistance in $F_2$ even if not properly blown.

In a different failure situation, where fuse $F_1$ is partially defective due to contamination or manufacturing faults which result in a resistance for instance of 100K ohms, the present circuit arrangement, with fuse $F_2$ blown, will still provide acceptable performance. The voltage dividing ration in this instance will be as good a voltage dividing ratio as the prior art circuit, provided in instances where the single fuse $F_1$ of FIG. 1 is conducting and the resistor $R_1$ has the main voltage drop. Since the ratio of resistances from $R_1$ to $F_1$ (conducting) is about 500 ohms ($F_1$) to 100K ohms ($R_1$) or 200:1, this is not too dificult from 100K ohms ($F_1$-defective) to 10 megaohms ($F_2$-blown) or 100:1. In addition to the added reliability, this circuit, even in this defective mode, will draw only approximately one-tenth the current drawn by the prior arrangement, and will therefore consume considerably less power.

Figure 3:
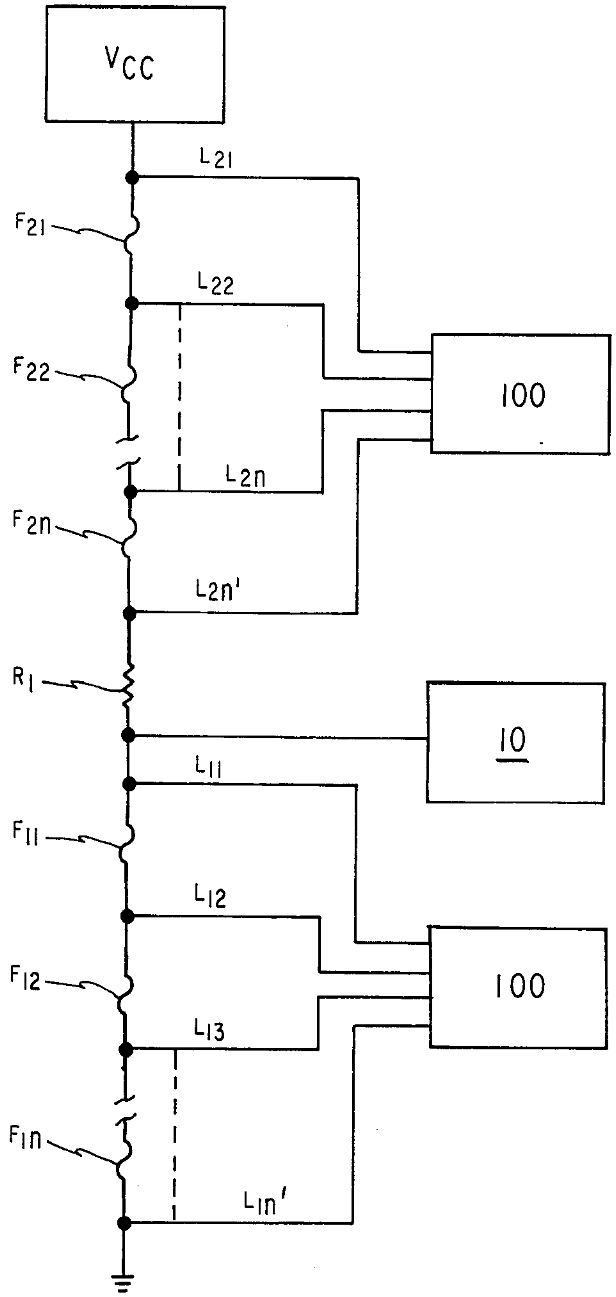
FIG. 3 is a circuit diagram illustrating another embodiment of the invention.

In those instances where a voltage high condition is desired, fuse $F_2$ remains unblown and the circuit operates exactly as in the prior art. Thus, fuse $F_1$ is blown and the current drain is very low, on the order of $\frac{1}{2}$ microamp. Thus, according to the present invention, it is possible to obtain a programmable level generator which draws about $\frac{1}{2}$ microamp or less at either a voltage high or a voltage low condition resulting in a power savings of at least 10:1—and typically 50:1 relative to prior arrangements in a typical situation where about half the circuits are programmed at a high and half are programmed at a low condition. However, in another implementation of the invention, there is a marked benefit even over those situations described above. Referring now to FIG. 3, the operation of the circuit provides benefits not previously available. Specifically, this circuit provides a safety mechanism in the event that one of the fuse elements completely fails to operate as desired. If it is desired to establish a voltage high condition at the sense amp, all of fuses $F_{11}$, $F_{12}$ through $F_{1n}$ are blown and fuses $F_{21}$, $F_{22}$ through $F_{2n}$ are unblown. This establishes a ten mega-ohm per fuse resistance in the lower portion of the bridge circuit and a 100K ohm (plus about 500 ohm per fuse) resistance in the upper bridge portion. However, even if one of fuses $F_{21}$ through $F_{2n}$ is not fully conducting, the large resistance in the lower bridge portion will still create an acceptable voltage level at the sense amp for reliable operation in a voltage high condition. Additionally, if a voltage low is desired and the fuses in the upper branch of the circuit, for instance, fuse $F_{22}$ does not blow under conditions which should ordinarily cause a fuse to blow, the resistance in the upper branch of the circuit would be ten megaohm per blown fuse plus one k-ohm for the resistor $R_1$. Notwithstanding the failure of fuse $F_{22}$ to blow, the combined resistances of the blown fuses in the upper branch will be very high in comparison with the approximately 500 ohms per unblown fuse in the lower branch and the input level on line 20 will still be a voltage low.

The scheme described in FIG. 3 is preferred over the schemes utilized in the prior art when extremely low-power operation is desired because it is designed such that several megaohms resistance will exist in the DC path regardless of whether the sense element is set at a logic high or a logic low. Further, the present invention increases the final device yield because a fuse can fail to perform as desired yet the difference in resistance between the upper and lower branch of the circuit will still be sufficient to guarantee reliable circuit operation. Furthermore, there will be better reliability of the final circuits. In those instances where one of the fuses fails after initially performing properly, the circuit will still be operational due to the difference in resistance between the one failed fuse and the multiple fuses on the opposite side of the branch which are operating properly. While it is recognized that this arrangement is more complex than the arrangement of the prior art and may require a larger area on the chip, it substantially reduces the ICCSB. Since this arrangement is intended primarily for use in architecture fuses, the tradeoff is not detrimental to the overall circuitry. It is noted that further improvements in reliability, performance and power reduction can be achieved by increasing the number of fuses in each leg of the resistive bridge circuit.

While there may be a trade off between quality and cost, the present invention provides an approach which provides substantial improvements in quality without an increase in cost. In some instances, the saving in areas made possible by reducing the resistor size will result in a less expensive overall device. Due to the plurality of fuses in the two branches of the bridge network, it is no longer necessary to rely on the resistor $R_1$ to provide a significant voltage drop. Thus, its additional function of avoiding excess currents prior to programming may be achieved with a resistance of 20,000 ohms. Due to this smaller resistance, it is possible to save area on the semiconductor device and to thereby offset the area needed for the extra fuses and the associated control circuitry. An additional benefit derived from the present invention centers around the problems associated with the fabrication of resistors in MOS devices. It is generally difficult to repeatedly fabricate resistors of a given resistance and size in MOS technologies. Thus, a larger than necessary amount of area is consumed by resistors. Since the present invention allows the selection of smaller resistors than was previously possible, a significant savings in area is made possible. In the past, the resistor was required to be the primary voltage reducing means in those devices where the fuse was not blown. Thus, the reliability, uniformity and integrity of the resistor was critical to device operation. However, according to the present invention, the fuses are the primary voltage reducing means and the need for quality resistors is obviated. It is to be noted that any resistive element may be conveniently utilized such as a semiconductor device.

In order to properly control the programming of the logic level at the sense amp it is necessary to provide a programming connection. The type of connection provided in the past has generally consisted of a high voltage access port to which a "programming voltage" could be passed through the bridge network if it was desired to blow the fuse $F_1$. However, in view of the multiple fuse arrangement of the present invention it is necessary to be able to access individual fuses to insure proper blowing of each fuse in a controllable manner.

Figure 5:
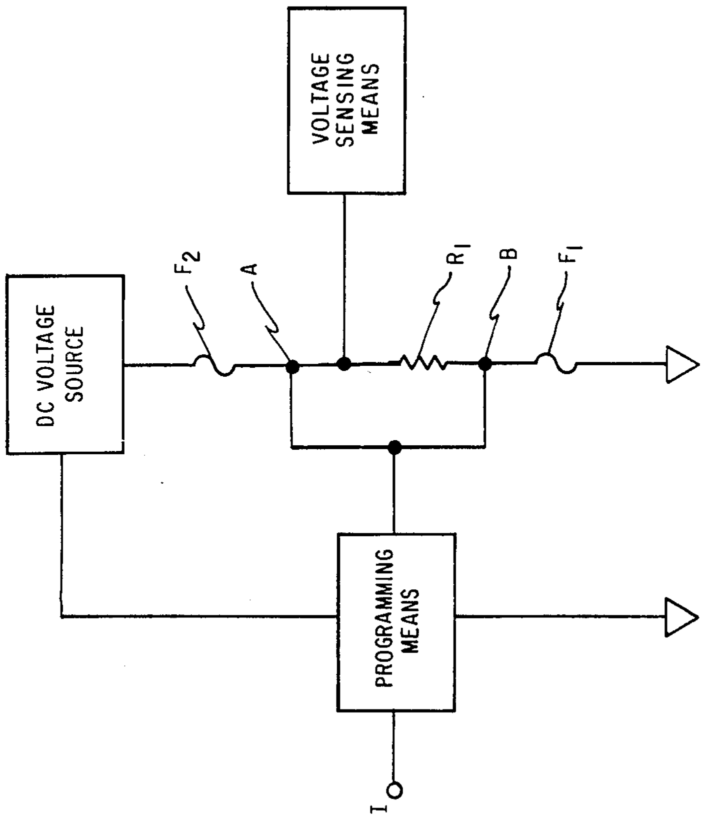
FIG. 5 is a circuit diagram of the circuit of the invention showing the programming means.

In order to selectively blow one of the fuses, the following procedure may be followed. The voltage on the DC voltage source is set at a programming voltage which for descriptive purposes will be assumed to be more than twice the normal operating voltage of the circuit. Since normal operating voltage is about 5 volts, the programming voltage will be assumed to be 12 volts. In order to blow a fuse, the programming voltage is applied across a single fuse for a duration of typically 5 mS. This is accomplished by providing a programming means which can selectively apply either the DC programming voltage or ground potential to the center of the bridge at the same time and for the same duration as the programming voltage is provided across the bridge network. This effectively causes the entire programming voltage to appear across only one leg of the bridge. The 5 mS duration has been found sufficient to cause the fuse to blow and thus cause ICCSB to drop to less than 5 microamps. In a preferred arrangement, the entire programming voltage is applied across a single fuse rather than across the entire leg of the bridge to thereby avoid the application of programming voltage across resistor $R_1$. FIG. 5 shows an arrangement where the programming may be accomplished as described. The voltage applied to nodes A and B is the 12 volt programming level if fuse $F_1$ is to be blown. Alternatively, nodes A and B are held at ground potential during the programming voltage pulse from the DC voltage source if fuse $F_2$ is to be blown.

In the embodiment of the invention having a plurality of fuses in each branch of the bridge network, it is necessary to provide additional connections.

This can be conveniently implemented in accordance with the invention by providing a programming connection to the center node of the resistive bridge and to each node between the various fuses. This is shown in FIG. 3 where programming circuitry 100 has Lines $L_{1l}$ through $L_{1n}$ which access the nodes in the upper leg of the bridge circuit and where Lines $L_{2l}$ through $L_{2n}$ access the nodes in the lower leg of the bridge circuit. This permits independent application of programming voltages to each fuse. The means for blowing selected ones of said fuses then consists of providing sufficient voltage across, and current though, the selected fuse to cause blowing. Since each fuse can be individually accessed, optimum resistance levels can be obtained. Obviously, simple embodiments could provide for simultaneously blowing all fuses in a selected branch of the bridge circuit or for blowing at least one of the fuses in the selected branch of the bridge circuit.

The manner in which the sense amps' desired logic level is programmed is as follows. The resistive divider networks shown in FIGS. 3 and 5 have at least one fuse in each of the upper and lower leg of the resistive divider networks. Referring to FIG. 5 for simplicity, the fuse $F_2$ in the upper leg can be blown without blowing of fuse $F_1$ in the lower leg by applying a pulse of a programming voltage to fuse $F_2$ in response to the application of a programming signal to input 1 of the programming means. The programming singal contains information which activates a programming mode of operation for the circuit which might include the increase from 5 volts to 12 volts of the voltage output from the DC Voltage Source in response to a program mode signal from the programming means. Additionally, the programming signal can contain information indicating whether the DC sense amp is to be programmed to a voltage high or a voltage low logic level. Under the control of the programming means, the 12 volt output of the DC voltage source is applied to the resistive bridge. Simultaneously, the programming means provides for the connection of nodes A and B to either ground—for logic low programming, or—to the 12 volt DC source for logic high programming. A pulse of about 5 mS is sufficient to cause the individually selected fuse to blow when the 12 volt signal is established across the specifically selected fuse.

In like manner, the separate individual fuses, for example fuses $F_{2l}$ through $F_{2n}$ of the upper leg of the resistive divider network illustrated in FIG. 3 can be selectively blown. In this instance, the programming signal designates that a voltage high output logic level is desired for the circuit. Initially, fuse $F_{21}$ can be blown by providing a connection from line $L_{22}$ to ground during the application of the programming level 12 volt pulse from the DC Voltage Source. Fuses $F_{22}$ through $F_{2n}$ can be successively accessed in like manner. However, time can be conserved by simultaneously accessing each of fuse $F_{21}$ through $F_{2n}$ through their two access lines. Thus, line $L_{21}$ may provide 12 volts, line $L_{22}$ may be held at ground, and each alternating line may be at 12 volts and ground respectively to thus simultaneously program or blow all of fuses $F_{21}$ through $F_{2n}$. However, individual access need not be given up even in this simultaneous programming implementation.

If, for instance, it is determined that $F_{2n}$ is to remain unblown, this may be accomplished by applying same potential to line $L_{2n}$ and line $L_{2n'}$. Thus, no current would flow through $F_{2n}$ and it would remain unblown. Similarly any one or more other fuses may be individually controlled in this manner. Thus, the blowing of any fuse is controlled by individually and separately controlling the application of a voltage (or current) pulse to each fuse in the network. For the normal situation where all fuses in one leg for example the upper leg, are to be blown and none of the fuses in the lower leg are to be blown, the above described alternate high/low voltages on the lines $L_{2l}$-$L_{2n}$ for the upper leg will establish the preferred logic level with maximum voltage differentiation between the upper and lower legs.

Figure 4:
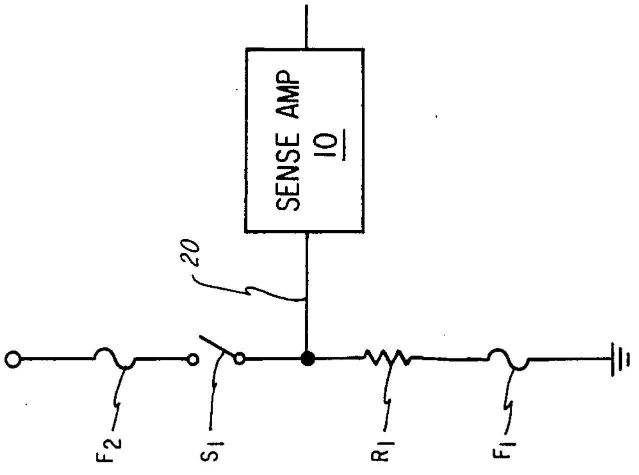
FIG. 4 shows an embodiment of the invention having a switch provided for testing of the circuitry.

Another aspect of the present invention is illustrated in FIG. 4 which shows a switch $S_1$ in the resistive bridge network in the upper leg of the bridge. The significant factor in locating the switch is that it be in the leg of the network which does not contain the resistor $R_1$. When the switch is open, the circuitry connected to the sense amp can be tested as though a voltage low condition is programmed. Then, for testing of the circuitry when receiving a voltage high input, the switch is closed and the presence of resistor $R_1$ will establish a voltage high condition. This switch $S_1$ then permits full testability of the circuitry to which the sense amp is connected without the need to program the fuses prior to testing. This also allows the ICCCSB of the rest of the chip to be tested when switches are open.

$S_1$ is a P channel MOS device which is normally ON but can be controlled by the test mode signal to allow $S_1$ to be turned OFF. $R_1$ is needed for testing because with the switch ON, its resistance is high enough to prevent the definate creation of a voltage high condition at the sense element unless $R_1$ in included.

Figure 6:
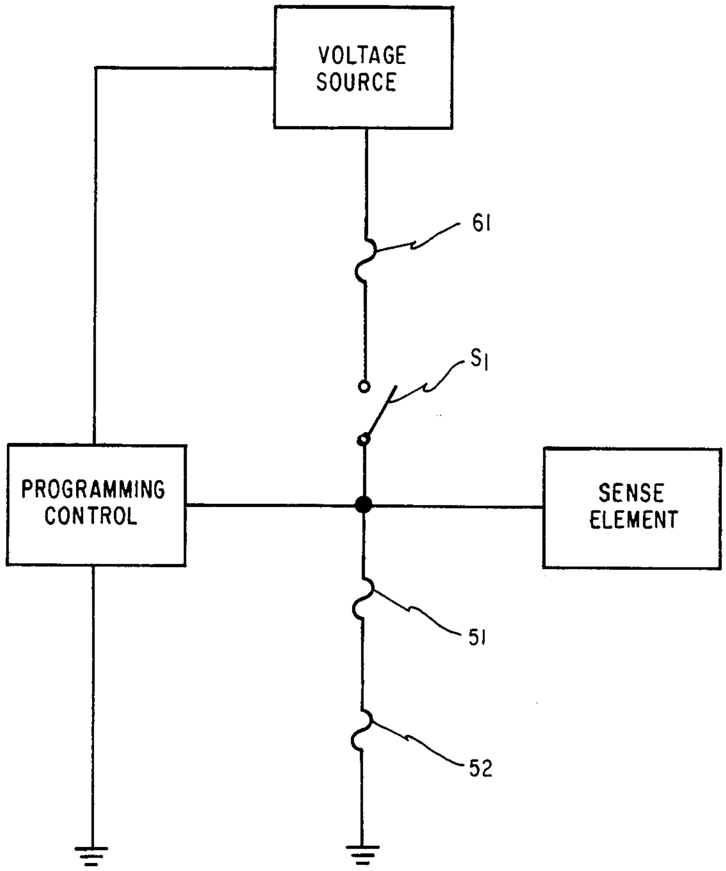
FIG. 6 is a circuit diagram of another embodiment of the invention.

However, in an additional implementation of the invention as shown in FIG. 6, it is possible to omit the resistor yet still maintain full circuit testability which is made possible through the use of switch $S_1$. By providing at least one fuse in one leg of the bridge, and including switch $S_1$ in this first leg and providing at least one fuse more in the second leg than containted in the first leg, the resistor is no longer needed. The combined resistance of fuses 51 and 52, when in an unblown condition, is about 1,000 ohms, while the combined resistance of fuse 61 and switch $S_1$ in an ON state is about 500 ohms. This differential resistance is sufficient to establish a voltage high condition which is detected as such by the SENSE ELEMENT. Alternately, when switch $S_1$ is OFF, its resistance exceeds 10 megaohms which dominates the resistances of fuses 51 and 52 in the resistive bridge, thereby establishing a voltage low condition to be detected by the SENSE ELEMENT.

From the preceding description of the preferred embodiments it is evident that the objects of the invention are attained, and although the invention has been described and illustrated in detail, it is to be clearly understood that the same is by way of illustration and example only and is not meant to be taken by way of limitation. It is intended that the following claims shall be interpreted in accordance with the full scope of the underlying invention including any and all variations thereof which might be suggested or obvious to those skilled in the semiconductor arts.

What is claimed is:

1. An improved circuit arrangement for a digital logic element comprising;

a signal sensing element having an input terminal and an output terminal, said input terminal connected to a first node between a ground node and a signal source, at least one first fuse element connected between said first node and said ground node, at least one second fuse element connected between said first node and said signal source, means for blowing selected ones of said fuse elements.

2. A circuit as claimed in claim 1 wherein a first plurality of fuse elements are connected in series between said first node and said ground node.

3. A circuit as claimed in claim 1 wherein a first plurality of fuse elements are connected in series between said first node and said signal source.

4. A circuit as claimed in claim 2 wherein a second plurality of fuse elements are connected in series between said first node and said signal source.

5. A circuit as claimed in claim 1 comprising a switch means connected in series between said first node and said ground node.

6. A circuit as claimed in claim 5 further comprising a resistive element in series with said at least one second fuse element between said first node and said signal source.

7. A circuit as claimed in claim 6 wherein said switch means is an MOS device.

8. A circuit as claimed in claim 1 further comprising a switch means connected in series with said at least one second fuse element between said first node and said signal source.

9. A circuit as claimed in claim 8 further comprising a resistive element connected in series with said at least one first fuse element between said first node and said ground node.

10. A circuit as claimed in claim 5 wherein said at least one first fuse element includes not more than half as many fuses as are included in said at least one second fuse element.

11. A circuit as claimed in claim 4 wherein said means for blowing selected ones of said fuse elements comprises a means for independently providing a programming voltage to each of said fuse elements.

12. A circuit as claimed in claim 8 wherein said at least one second fuse element includes not more than half as many fuses as are included in said at least one first fuse element.

13. A method of establishing a programmed logic level in a DC sense amp having a least one fuse in each of a first and a second leg of a resistive divider network comprising the steps of;

blowing all fuses in said first leg of said divider network without blowing any fuses in said second leg of said divider network by individually and separately applying a pulse of a programming voltage to each fuse in said first leg of said divider network.

14. A method as claimed in claim 13 wherein:

said pulse of programming voltage is applied in response to a programming signal which activates a programming mode for a programming means.

15. An improved voltage divider network suitable for use in a CMOS sense amp compromising;

a DC supply, first and second fuses of the type having a resistance of between about 100 ohms and 1000 ohms when in an unblown condition and having a resistance exceeding about 1 megaohm when in a blown condition, a resistive element of between about 1000 ohms and 100,000 ohms, said resistive element and said first fuse connected is series to form a first leg of said divider network, said second fuse forming a second leg of said divider network, said first leg connected in series with said second leg between said DC supply and ground, voltage sensing means for distinguishing between voltage high and voltage low conditions at the series connection of said first and second legs, and programming means for selectively blowing one of said fuses.

16. A circuit as claimed in claim 15 wherein a switch means is provided in series with said second fuse in said second leg of said divider network.

17. A circuit as claimed in claim 16 further including a switch control means associated with a circuit test means whereby said switch can operate to cause said sense element to provide both high output and low output for complete circuit testing.

18. A fuse programmable DC sense arrangement comprising;

a first fuse means comprising at least one fuse, a second fuse means comprising at least one fuse, said second fuse means connected in series with said first fuse means at a series connection, a voltage sensing means for detecting the voltage state at said series connection of said first and second fuse means, a DC voltage source for providing a first operating voltage, and upon application of a programming signal a second programming voltage, a programming means for providing said programming signal to said DC voltage source and controlling the application of said programming voltage to individually select ones of said fuses in said first and second fuse means to blow said individually selected fuses and thereby program said DC sense arrangement.

19. A arrangement as claimed in claim 18 further including a switch means provided in series with said first fuse means and a resistive element provided in series with said second fuse means, said switch means being controllable to cause switching between a high and a low sense level prior to programming of said fuses to permit circuit testing of said unprogrammed sense arrangement.

* * * * *